United States Patent
Grant et al.

(10) Patent No.: US 7,771,563 B2
(45) Date of Patent: Aug. 10, 2010

(54) SYSTEMS AND METHODS FOR ACHIEVING ISOTHERMAL BATCH PROCESSING OF SUBSTRATES USED FOR THE PRODUCTION OF MICRO-ELECTRO-MECHANICAL-SYSTEMS

(75) Inventors: Robert W. Grant, Camden, ME (US); Benjamin J. Petrone, Port Charlotte, FL (US); Paul D. Mumbauer, Orwigsburg, PA (US)

(73) Assignee: Sumitomo Precision Products Co., Ltd., Hyogo (JP)

( * ) Notice: Subject to any disclaimer, the term of this patent is extended or adjusted under 35 U.S.C. 154(b) by 699 days.

(21) Appl. No.: 10/991,554

(22) Filed: Nov. 18, 2004

(65) Prior Publication Data
US 2006/0102287 A1   May 18, 2006

(51) Int. Cl.
*H01L 21/306* (2006.01)
*C03C 25/68* (2006.01)

(52) U.S. Cl. .................... 156/345.51; 156/345.22; 118/729; 216/50

(58) Field of Classification Search .................. 118/719, 118/720, 733, 729; 156/345.22, 345.23, 156/345.31, 345.32, 345.54, 345.51; 216/58
See application file for complete search history.

(56) References Cited

U.S. PATENT DOCUMENTS

| | | | |
|---|---|---|---|
| 4,491,610 A | 1/1985 | Mansour | |
| 4,520,750 A | 6/1985 | Mansour | |
| 4,854,266 A * | 8/1989 | Simson et al. | 118/728 |
| 4,895,107 A * | 1/1990 | Yano et al. | 118/722 |
| 5,228,206 A | 7/1993 | Grant et al. | |
| 5,439,553 A | 8/1995 | Grant et al. | |
| 5,482,558 A * | 1/1996 | Watanabe et al. | 118/728 |
| 5,658,417 A | 8/1997 | Watanabe et al. | |
| 5,796,054 A | 8/1998 | Minami et al. | |
| 5,937,541 A | 8/1999 | Weigand et al. | |
| 5,956,859 A | 9/1999 | Matsumoto et al. | |
| 6,002,109 A * | 12/1999 | Johnsgard et al. | 219/390 |
| 6,016,611 A | 1/2000 | White et al. | |
| 6,074,486 A | 6/2000 | Yang et al. | |
| 6,108,928 A | 8/2000 | Park et al. | |

(Continued)

FOREIGN PATENT DOCUMENTS

| | | |
|---|---|---|
| EP | 1345255 | 9/2003 |
| JP | 04215429 | 8/1992 |

*Primary Examiner*—Sylvia R. MacArthur
(74) *Attorney, Agent, or Firm*—Michael B. Fein; Cozen O'Connor

(57) ABSTRACT

A system and method for processing substrates that achieves isothermal and uniform fluid flow processing conditions for a plurality of substrates. In one aspect, the invention is a system and method that utilizes matching the emissivity value of the surfaces of a process chamber that oppose exposed surfaces of the substrates with the emissivity value of the exposed surfaces to achieve isothermal conditions throughout a substrate stack. In another aspect, the invention is system and method of processing substrates in a process chamber that exhibits excellent fluid flow uniformity by eliminating cavities or geometrical irregularities in the process chamber profile due to substrate loading openings. In yet anther aspect, the invention is a system and method of processing substrates wherein the process chamber comprises a liner and a shell, the liner constructed of a highly thermally conductive material, such as carbon, and the shell is constructed of a non-porous material, such as stainless steel.

24 Claims, 13 Drawing Sheets

U.S. PATENT DOCUMENTS

| | | | |
|---|---|---|---|
| 6,161,304 A | 12/2000 | Iaccino et al. | |
| 6,164,963 A * | 12/2000 | Weaver | 432/241 |
| 6,176,023 B1 | 1/2001 | Doche | |
| 6,178,660 B1 | 1/2001 | Emmi et al. | |
| 6,185,839 B1 | 2/2001 | Kholodenko et al. | |
| 6,247,245 B1 | 6/2001 | Ishii | |
| 6,248,672 B1 * | 6/2001 | Takagi | 438/758 |
| 6,286,231 B1 | 9/2001 | Bergman et al. | |
| 6,332,280 B2 | 12/2001 | Kato et al. | |
| 6,357,142 B1 | 3/2002 | Bergman et al. | |
| 6,391,804 B1 | 5/2002 | Grant et al. | |
| 6,399,923 B2 | 6/2002 | Kano et al. | |
| 6,402,849 B2 * | 6/2002 | Kwag et al. | 118/715 |
| 6,428,847 B1 | 8/2002 | Grant et al. | |
| 6,487,791 B2 | 12/2002 | Kato et al. | |
| 6,493,961 B2 | 12/2002 | Ishii | |
| 6,499,229 B2 | 12/2002 | Kato et al. | |
| 6,560,896 B2 | 5/2003 | Granneman et al. | |
| 6,725,564 B2 | 4/2004 | Hunter et al. | |
| 6,792,693 B2 | 9/2004 | Huang | |
| 6,921,466 B2 * | 7/2005 | Hongo et al. | 204/198 |
| 6,953,739 B2 * | 10/2005 | Yang et al. | 438/488 |
| 2003/0000476 A1 * | 1/2003 | Matsunaga et al. | 118/719 |
| 2004/0065261 A1 | 4/2004 | Chen et al. | |
| 2005/0098264 A1 * | 5/2005 | Wolf et al. | 156/345.32 |

* cited by examiner

SYSTEMS AND METHODS FOR ACHIEVING ISOTHERMAL BATCH PROCESSING OF SUBSTRATES USED FOR THE PRODUCTION OF MICRO-ELECTRO-MECHANICAL-SYSTEMS

FIELD OF THE INVENTION

The present invention relates generally to systems and methods for processing substrates, and specifically to systems and methods for processing substrates for the manufacture of Micro-Electro-Mechanical-Systems ("MEMS"). However, the invention can also be applied to the manufacture of integrated circuits, raw substrates, lead frames, medical devices, disks and heads, flat panel displays, microelectronic masks, and other applications requiring highly isothermal processing conditions within a process chamber.

BACKGROUND OF THE INVENTION

MEMS device manufacturing includes, among other things, the construction of physical elements that are added to traditional solid-state circuitry on chips known as integrated circuits ("ICs"). These physical elements can add significantly to the functional capability of ICs. For example, accelerometers, gyroscopes, gas density sensors, chemical or enzyme sensors, optical projection or redirection devices, micro-pumps, and pressure sensors have been fabricated. Usually, the physical motion or reaction of the element to external forces is measured through changes in capacitance, inductance, intrinsic resistance, etc. In other instances, the MEMS element can cause physical action rather than merely measuring physical forces. For example, such as in micro-pumping or mirror angle change.

At first the construction methodology to form these physical elements were reactive ion etching (RIE) and chemical bath etching processes in chemicals such as hydrofluoric acid ("HF"), mainly because the technology needed to carry out these methodologies were readily available from IC fabs. The features that could be produced with these methods and equipment tended to be purely vertical. If the features became largely horizontal and/or undercut, the features had to be large enough so liquid could be withdrawn from the undercut spaces in the substrate at the end of the liquid bath processing. As undercut features became smaller and smaller, withdrawing or drying out the small capillaries or undercut features became more challenging. Liquid to wall adhesion, or surface tension, tends to cause collapse of the thin overhanging features, thereby destroying the device. This defect has been named "stiction."

In addition to stiction, other challenges and disadvantages are associated with HF bath etching, namely the inability to control material etching selectivity (oxide1 vs. oxide2). Still another challenge relates to selectivity of the metals that can be used to make contacts to the MEMS elements such as Aluminum, Copper, Gold, Silver, Titanium Nitride and other conductive materials.

In an attempt to help eliminate some of the disadvantages noted above in early MEMS etching/construction techniques, an HF and alcohol etching process was developed in the early 1990s as an alternative to the traditional HF water etch process. The HF/alcohol etching process helped solve some of the purely chemical issues but did not help with the "stiction" problem, especially as features started to shrink toward the 10 or even 1 micron scale. While solid state circuit elements were already being manufactured in the micron scale at that time, MEMS are physical elements which presented special problems that inhibited production at such a scale. As such, a better process was needed that could etch small pathways without creating "stiction" and without attacking adjacent materials.

In the middle 1990s, a process called Super-Critical-$CO_2$ drying was developed. This process, which operates at about 2000 PSI and at about 30 degrees C. and uses carbon dioxide ("$CO_2$") gas, is able to remove liquids from small capillaries. This process was marginally successful but was cumbersome because it required a separate piece of equipment that allowed the MEMS chips to partially dry during transport to the super-critical $CO_2$ equipment, thereby causing "stiction." Therefore, problems remained.

A gas phase, atmospheric pressure HF/alcohol process was then developed to eliminate some of the problems with wet etching. Although the gas phase HF/alcohol was able to etch in small places, it often left liquid residues based on the byproducts of the etch since the byproduct vapor pressure was so low compared to the processing pressure. In order to remedy this problem, a gas phase HF/alcohol at reduced pressure was developed. An example of a reduced pressure gas phase HF/alcohol etching process for MEMs substrates is set forth in U.S. Pat. No. 5,439,553, Grant et al., the entirety of which is incorporated by reference.

The reduced pressure gas phase HF/alcohol processes overcame many of the deficiencies of the atmospheric HF/Alcohol process, such as the elimination of "stiction" and the minimization of attack of companion materials such as metals. The reduced pressure process was developed in single-substrate reactors/process chambers, which in turn were integrated into cluster tools using, for example, a Brooks Automation robotic handler. A typical example of a single-substrate processing reactor in which the reduced pressure gas phase HF/alcohol etching is performed is disclosed in U.S. Pat. No. 5,228,206, Grant et al., the entirety of which is incorporated by reference. In order to control "stiction" and selectivity, however, the application of the HF/Alcohol gas at reduced pressure proved to be a fairly lengthy process, taking 20 to 30 minutes or longer to achieve complete release etching. In order to become viable in production it was thought that the process needed to be reduced to 4 minutes. Moreover, etch uniformity was critical and had to be maintained well ahead of the 10% uniformity limit throughout the substrate. This proved to be difficult due to the construction requirements of cluster tool applications and the non-uniformity in processing conditions within existing MEMs processing tools. The non-uniformity of process conditions were in part due to the substrate loading and unloading requirements and other process control design criteria, which placed a burden on fluid dynamics and temperature differentials.

Batch processing of substrates is one way in which the throughput of substrate processing in the field of ICs has been increased. However, batch processing of substrates in the IC field involves wet processing techniques, which, for the reasons set forth above, can not be used for constructing MEMS. Additionally, the requirements for etching uniformity in MEMS construction is much stricter than that in IC manufacturing. Thus, reactor systems that can process batches of substrates for MEMS construction with acceptable production yield do not exist.

Despite these hurdles, the present inventor undertook the task of designing and building a reactor/process chamber system for the batch processing of substrates for MEMS construction, and specifically for implementing reduced pressure gas phase HF/alcohol etching processes, which depend heavily on the vapor pressures and partial pressures of the constituent gases. The problem in implementation however came in the form of substrate-to-substrate processing uniformity. More specifically, initial reactor system designs and processing conditions resulted in the top and bottom substrates in a stack of substrates being etched differently than the rest of the batch. Also, typical "gate opening" features where substrates are loaded into the process chamber of the reactor created a swirl or disturbance of the gas flow in the reactor. FIG. 1 illustrates a MEMS reactor 10 having a gate opening 11 in the process chamber that causes a swirling action of the process gases about the substrate 12, during processing. This swirling has proven to cause a recirculation pattern which affects the fluid boundary layer and the etch uniformity on the substrate. Also, control of the temperature of purely stainless steel or nickel reactors (required due to material compatibility with HF gas) was difficult. The variability of the processing had to be overcome in order to etch MEMS features uniformly across all substrates.

SUMMARY OF THE INVENTION

It is therefore an object of the present invention is to provide systems and methods that facilitate the batch processing of substrates for MEMS construction.

Another object of the present invention is to provide systems and methods for the batch processing of substrates that have improved uniformity of fluid flow dynamics.

Still another object is to provide systems and methods for the batch processing of substrates that result in improved isothermal conditions.

Yet another object is to provide systems and methods for the batch processing of substrates that can be used to promote increased uniformity in etching across all substrates being processed.

A further object is to provide systems and methods for the processing of substrates for MEMS construction which increases throughput and decreases processing time on a per substrate basis.

A still further object is to provide systems and methods for the batch processing of substrates having improved temperature uniformity within the process chamber of the reactor.

These and other objects are met by the present invention which in one aspect is a system for processing substrates comprising: a first housing forming a process chamber; means for supporting a plurality of substrates in a stacked orientation in the process chamber, wherein when the plurality of substrates are supported in the stacked orientation, the stacked orientation comprises a first substrate having an exposed surface and a last substrate having an exposed surface, the exposed surfaces of the first and last substrates having an emissivity value; and wherein surfaces that oppose the exposed surfaces of the first and last substrates when the plurality of substrates are supported in the stacked orientation within the process chamber have an emissivity value that corresponds to the emissivity value of the exposed surfaces of the first and last substrates. As used herein, an opposing surface is a surfaces of any structure of the system that opposes one of the exposed surfaces of the first or last substrates when the stack of substrates is supported in the process chamber for processing.

Emissivity is a measure of the thermal emittance of a surface. It is defined as the fraction of energy being emitted relative to that emitted by a thermally black surface (a black body). A black body is a material that is a perfect emitter of heat energy in that it emits all energy it absorbs and has an emissivity value of 1. In contrast a material with an emissivity value of 0 would be considered a perfect thermal mirror and imaging this material would result in readings of reflected energy only and not the actual material. For example, if an object had the potential to emit 100 units of energy but only emits 90 units in the real world. That object would have an emissivity value of 0.90.

It was discovered that when the emissivity values of the opposing surfaces and the exposed surfaces of the first and last substrates do not correspond with one another, such as when the opposing surfaces were stainless steel and the substrates were silicon substrates, the first and last substrates in the stacked orientation were more likely to etch at a different rate than the other substrates (i.e., the middle substrates). This was likely due to the first and last substrates being at a different temperature(s) than the substrates located between the first and last substrates. A higher temperature could cause a slower etch due to the loss of "stuck" gases on the substrates' surfaces which are necessary to carry out the etch. A lower temperature could cause a faster etch due to accumulation of byproducts on the exposed surfaces that would further enter into the etch reaction, thereby increasing the etch rate.

It was discovered that the emittance of thermal energy from the opposing surfaces was the primary cause of temperature variations of the first and last substrates. It was also discovered that radiation is the strongest influence on substrate temperature, over convection, at reduced pressure conditions (e.g., below 500 Torr). By ensuring that the emissivity values of the opposing surfaces of the system and the exposed surfaces of the first and last substrates correspond to one another, one cause of temperature non-uniformity among the substrate stack is eliminated and/or reduced. In other words, by more closely matching the emissivity value of the opposing surfaces with the emissivity value of the exposed surfaces of the first and last substrates, close temperature control was achieved for all of the substrates in the stacked orientation.

In an embodiment, the emissivity value of the opposing surfaces correspond to the emissivity value of the exposed surfaces within a range of about 0.2. In another embodiment, the emissivity values of the opposing surfaces and the exposed surfaces are approximately equal. In one embodiment, the substrates are silicon substrates and the opposing surfaces are silicon carbide.

The opposing surfaces can be inner surfaces of the first housing that form the process chamber or the opposing surfaces can be the surfaces of any other structure(s) of the system. In an embodiment where the supporting means comprises a first substrate support plate and a second substrate support plate, the plurality of substrates being supported in the stacked orientation between the first and second substrate support plates, the opposing surfaces can be surfaces of the first and second substrate support plates. Irrespective of the structure on which the opposing surfaces are located, all of the inner surfaces of the first housing that form the process chamber can be constructed so as have an emissivity value that corresponds to the emissivity value of the exposed surfaces of the first and last substrates.

In another embodiment, the first housing comprises a shell and a liner located interiorly of the shell. In this embodiment, the liner is constructed of a material which has a high thermal conductance, such as for example a carbon based material. Examples of suitable carbon based materials include densified carbon, natural carbon, diamond, and graphite. When the liner is constructed of a carbon based material, the shell is preferably constructed of a non-porous material, such as for example stainless steel. The inner surfaces of liner will form the process chamber and preferably have an emissivity value that corresponds to the emissivity value of the exposed surfaces of the first and last substrates, such as for example silicon carbide.

It was discovered that the housing that forms the process chamber itself can affect temperature uniformity. By providing a liner constructed of a material having high thermal conductivity, a second cause of temperature non-uniformity is eliminated. In contrast, when the process chamber is formed by materials which are not good thermal conductors, such as for example stainless steel, as much as 5 degrees Celsius gradients would develop. This would occur even though up to four heat zones were used and controlled. By selecting a material that is a high thermal conductor for the lining, such as for example a densified carbon, very good thermal conductivity (even temperature) and matched emissivity (to the exposed surfaces) could by obtained. Matched emissivity is obtained in this embodiment by converting the inner surfaces of the carbon liner to silicon carbide.

In order to achieve fluid flow uniformity, an embodiment of the system can further comprise a gas inlet manifold and an exhaust manifold. The gas inlet manifold is provided so as to cover a gas inlet port in the shell and the exhaust manifold is provided so as to cover an exhaust port in the shell. A first gas diffuser plate can be operably coupled to the gas inlet port at a position between the gas inlet port and the gas inlet manifold. A second gas diffuser plate can be operably coupled to the exhaust port and positioned between the exhaust port and the exhaust manifold.

In still another embodiment, the system can further comprise a movable plate. In this embodiment, the supporting means is connected to the movable plate. The movable plate is movable between a loading position where the supporting means is located at least partially outside of the process chamber and a processing position where the supporting means is located entirely within the process chamber. When the movable plate is in the processing position, the movable plate forms at least a portion of a floor, wall, or ceiling of the first housing.

In yet another embodiment, a second housing can be provided that forms a loading chamber. The second housing has a common wall with the first housing. An opening is provided in the common wall that forms a passageway from the loading chamber into the process chamber. The movable plate is preferably located within the loading chamber. As such, when the movable plate is moved from the loading position to the processing position, the movable plate closes the opening. The second housing can also have a gate opening that forms a passageway from ambient air to the loading chamber. The gate opening can be used to load substrates onto the supporting means within the loading chamber. A gate valve can be operably coupled to the gate opening. When the gate valve is closed, the process chamber and the loading chamber will be hermetically sealed from the ambient air.

A seal can be provided between the movable plate and the common wall. When the seal is compressed therebetween, the process chamber is a closed environment. This is preferable for fluid flow uniformity.

It another embodiment, at least one source of gas can be operably coupled to the gas inlet port. Preferably, the at least one source of gas comprises a source of alcohol vapor and a source of hydrofluoric acid vapor. An exhaust system can be fluidly coupled to the exhaust port to remove gases from the process chamber. Furthermore, means to create a reduced pressure atmosphere in the process chamber, such as for example a dry pump, can be provided. Finally, means to heat the process chamber, such as for example mica-based resistance heaters, can be provided.

In order to maximize throughput, the supporting means should support 25 substrates. Of course if desired, more than 25 substrates could be processed. However, to achieve highest throughput with the automated handler (e.g. a Brooks 7 sided), and to process a complete substrate cassette at a time, a quantity of 25 substrates proved to be advantageous. Larger batches have diminishing returns.

In another aspect, the invention is a method of processing substrates comprising: providing a system having a first housing forming a process chamber; supporting a plurality of substrates in a stacked orientation, wherein the stacked orientation comprises a first substrate having an exposed surface and a last substrate having an exposed surface, the exposed surfaces of the first and last substrates having an emissivity value; positioning the plurality of substrates in the process chamber so that the exposed surfaces of the first and last substrates oppose surfaces that have an emissivity value that corresponds to the emissivity value of the exposed surfaces of the first and last substrates; and subjecting the plurality of substrates to at least one processing condition within the process chamber.

In still another aspect, the invention is a system for processing substrates comprising: a first housing forming a process chamber; an opening in the first housing that forms a passageway into the process chamber; a movable plate having means to support a plurality of substrates; means to move the movable plate between a loading position where the supporting means is located at least partially outside of the process chamber and a processing position where the supporting means is located entirely within the process chamber, wherein when in the process position the movable plate closes the opening; a gas inlet port in the first housing; and an exhaust port in the first housing.

This aspect of the invention helps to achieve uniform fluid flow within the process chamber, which in turn helps create a uniform flow related boundary layer. Achieving uniform boundary layers will help achieve uniform etching across substrate surfaces when the system is used for etching. In this aspect, the invention achieves uniform fluid flow within the process chamber by eliminating the substrate load/unload features (e.g. the gate opening) in the process chamber that could disturb cross flow gases, such as is illustrated in FIG. 1. Since it was discovered that cross flow was desirable for the operation of a multiple substrate reactor, this disturbance was eliminated since boundary layer thickness was affected, which is the second strongest influence in etch uniformity.

In one embodiment, at least one source of gas fluidly is coupled to the gas inlet port. When used for etching, the at least one source of gas can comprise a source of alcohol vapor and a source of hydrofluoric acid vapor. An exhaust system can be operably coupled to the exhaust port.

A seal can be positioned between the movable plate and the first housing to effectively separate the process chamber from the ambient air. Suitable seals include an O-ring seal. The seal helps prevent convection-loops or short circuit flows from taking place within the process chamber.

In order to achieve cross flow, the gas inlet port and the exhaust port can be located on opposite walls of the first housing. In this embodiment, a gas inlet manifold is positioned so as to cover the gas inlet port, and an exhaust manifold is positioned so as to cover the exhaust port. To achieve a more uniform cross flow, the inlet manifold and the exhaust manifold comprise distribution holes organized in a specialized pattern about the gas inlet port and the exhaust port respectively. The size of the distribution holes increases as distance from the gas inlet port (or the exhaust port) increases. Additionally, in order to eliminate undue velocity pressure, a first gas diffuser plate can be positioned between the gas inlet port and the gas inlet manifold and a second gas diffuser plate can be positioned between the exhaust port and the exhaust manifold. The process chamber preferably has a substantially constant cross-sectional profile from the inlet manifold to the exhaust manifold, such as for example a substantially constant rectangular cross-sectional profile. This results in a very streamlined and uniform fluid flow between all substrates.

In a further embodiment, this aspect of the invention further comprises means for creating a reduced pressure atmosphere in the process chamber. The means for creating the reduced pressure atmosphere can be operably coupled to the exhaust system, which is in turn coupled to the exhaust port. Means to heat the process chamber can also be provided.

In another embodiment, the system can further a second housing that forms a loading chamber. The second housing will have a common wall with the first housing. In this embodiment, the opening extends through the common wall and forms a passageway from the loading chamber into the process chamber. A gate opening is provided in the second housing that forms a passageway from ambient air into the loading chamber. The gate opening is used for loading substrates into the system for processing. A gate valve can be operably coupled to the gate opening. When the gate valve closed, the process chamber and the loading chamber are hermetically sealed from the ambient air.

This aspect of the invention can also comprise any of the characteristics discussed above in relation to thermal emissivity matching, the thermally conductive liner, and the specifics of the supporting means. However, in order to avoid redundancy, description of these characteristics will be omitted with the understanding that those skilled in the art will understand their applicability.

In yet another aspect, the invention is a method of processing substrates comprising: providing a system comprising a first housing forming a process chamber, an opening in the first housing that forms a passageway into the process chamber, a movable plate having means to support a plurality of substrates, means to move the movable plate between a loading position where the supporting means is located at least partially outside of the process chamber and a processing position where the supporting means is located entirely within the process chamber, a gas inlet port in the first housing, and an exhaust port in the first housing; supporting a plurality of substrates in the supporting means while the movable plate is in the loading position; moving the movable plate to the processing position, thereby closing the opening with the movable plate; and flowing a gas into the process chamber via the gas inlet port, over the plurality substrates, and out of the process chamber via the exhaust port.

In a further aspect, the invention is a system for processing substrates comprising: a first housing forming a process chamber; means to support a plurality of substrates in the process chamber in a stacked orientation; a gas inlet port in the first housing and an exhaust port in the first housing, the gas inlet port and the exhaust port being located on opposite walls of the first housing; a gas inlet manifold covering the gas inlet port and an exhaust manifold covering the exhaust port, wherein at least the gas inlet manifold comprises a plurality of holes arranged in a pattern such that size of the holes increases as distance from the gas inlet port increases; at least one source of gas operably coupled to the gas inlet port; an exhaust system operably coupled to the exhaust port; and wherein the process chamber has a substantially constant rectangular cross-sectional profile from the gas inlet manifold to the exhaust manifold. As with the other aspects of the invention, any or all of the details discussed above with respect to the other aspects of the invention can be incorporated into this aspect of the inventive system.

In a still further aspect, the invention is a method of processing substrates comprising: providing a system comprising a first housing forming a process chamber, means to support a plurality of substrates in the process chamber in a stacked orientation, a gas inlet port in the first housing and an exhaust port in the first housing, the gas inlet port and the exhaust port being located on opposite walls of the first housing, a gas inlet manifold covering the gas inlet port and an exhaust manifold covering the exhaust port, wherein at least the gas inlet manifold comprises a plurality of holes arranged in a pattern such that size of the holes increase as distance from the gas inlet port increases, at least one source of gas operably coupled to the gas inlet port, an exhaust system operably coupled to the exhaust port, and wherein the process chamber has a substantially constant rectangular cross-sectional profile from the gas inlet manifold to the exhaust manifold; supporting a plurality of substrates in the supporting means within the process chamber between the gas inlet manifold and the exhaust manifold; introducing a gas into the process chamber via the gas inlet port and the gas inlet manifold; flowing the gas over the plurality substrates; and removing the gas form the process chamber via the exhaust manifold and the exhaust port.

DETAILED DESCRIPTION OF THE DRAWINGS

Figure 1:
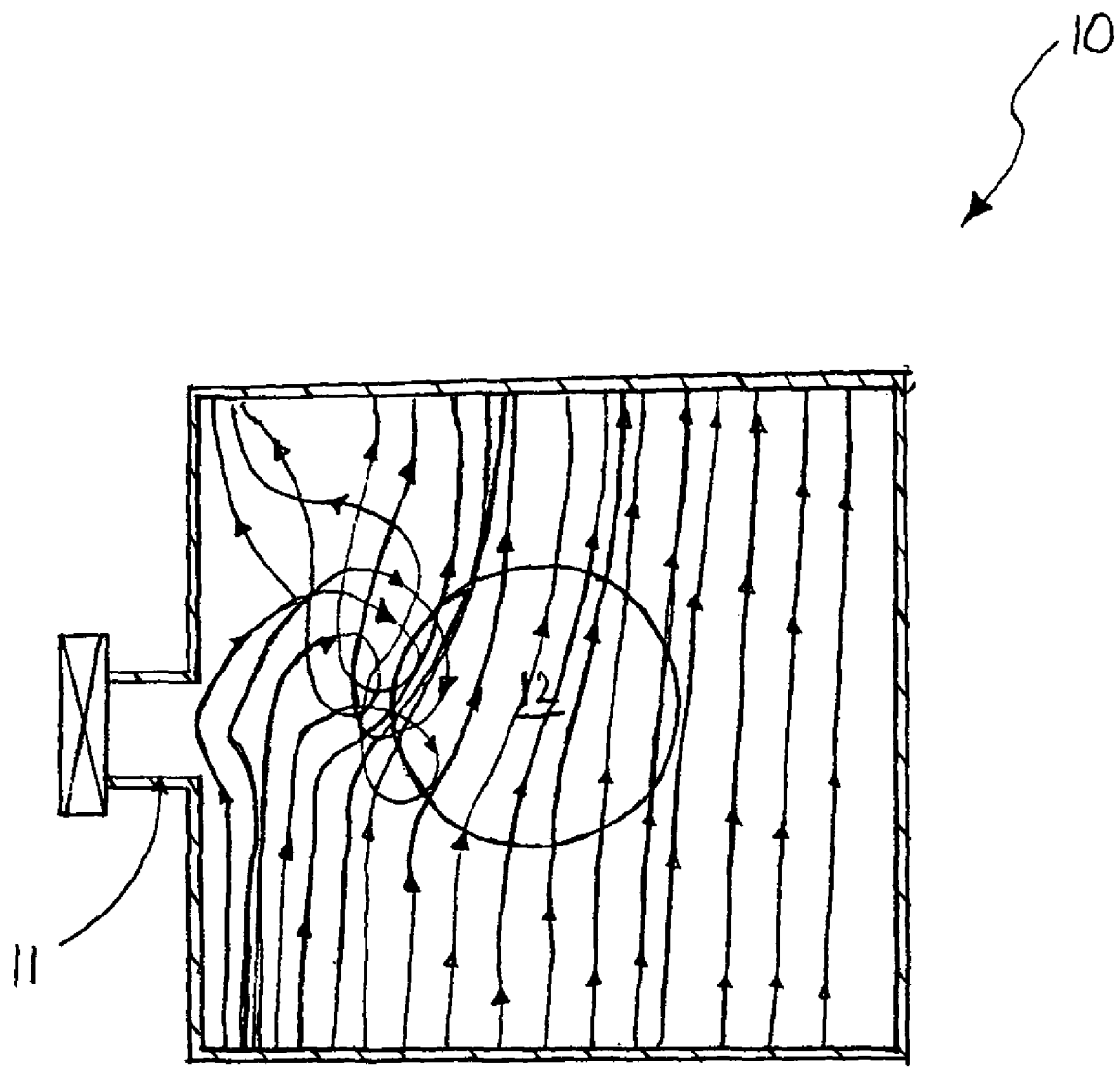
FIG. 1 is a schematic view of a prior art MEMS reactor illustrating how a gate opening creates a swirl or disturbance to fluid flow within the prior art MEMS reactor.
Figure 2:
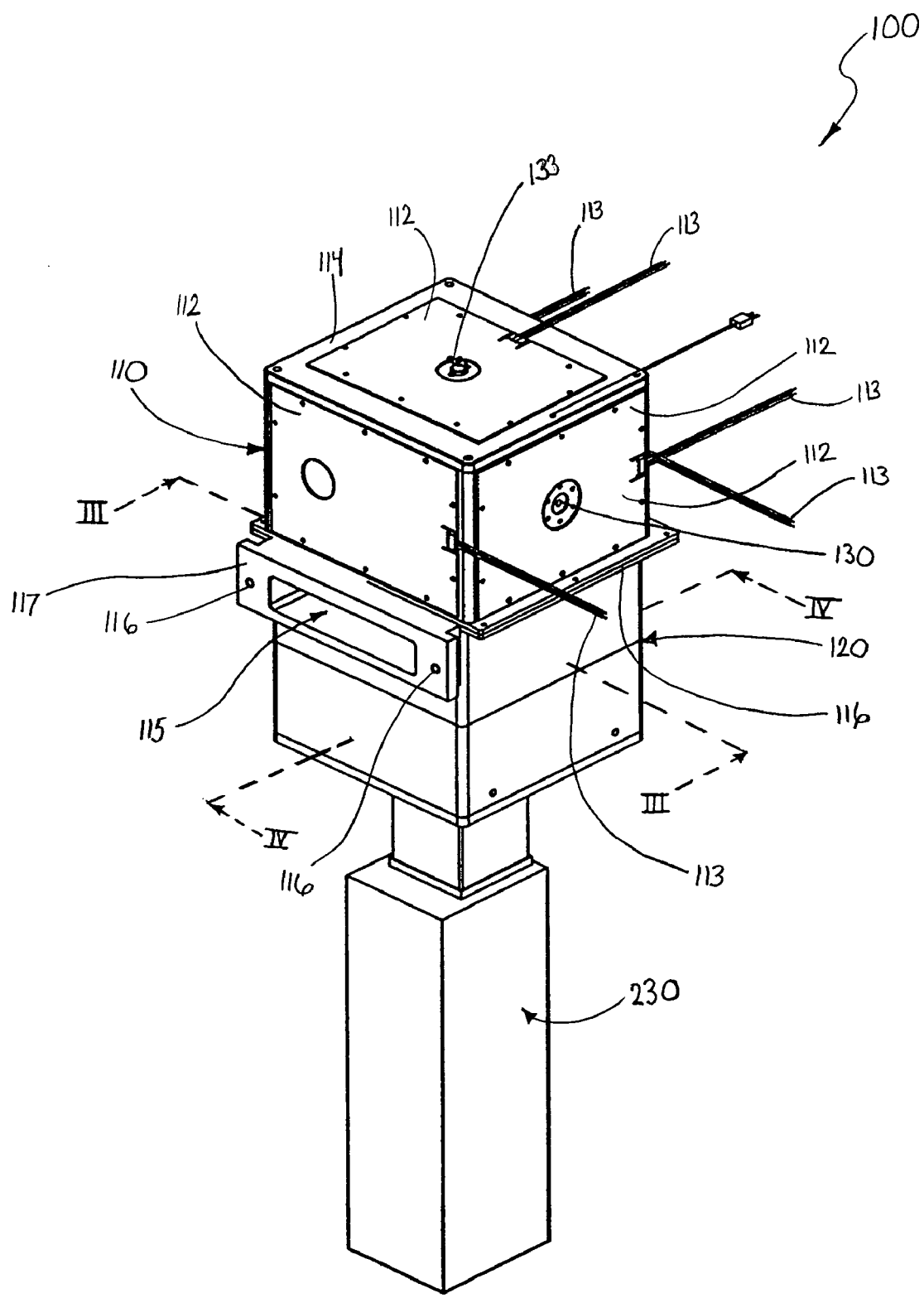
FIG. 2 is to perspective view of a dual chamber MEMS reactor according to an embodiment of the present invention.
Figure 3:
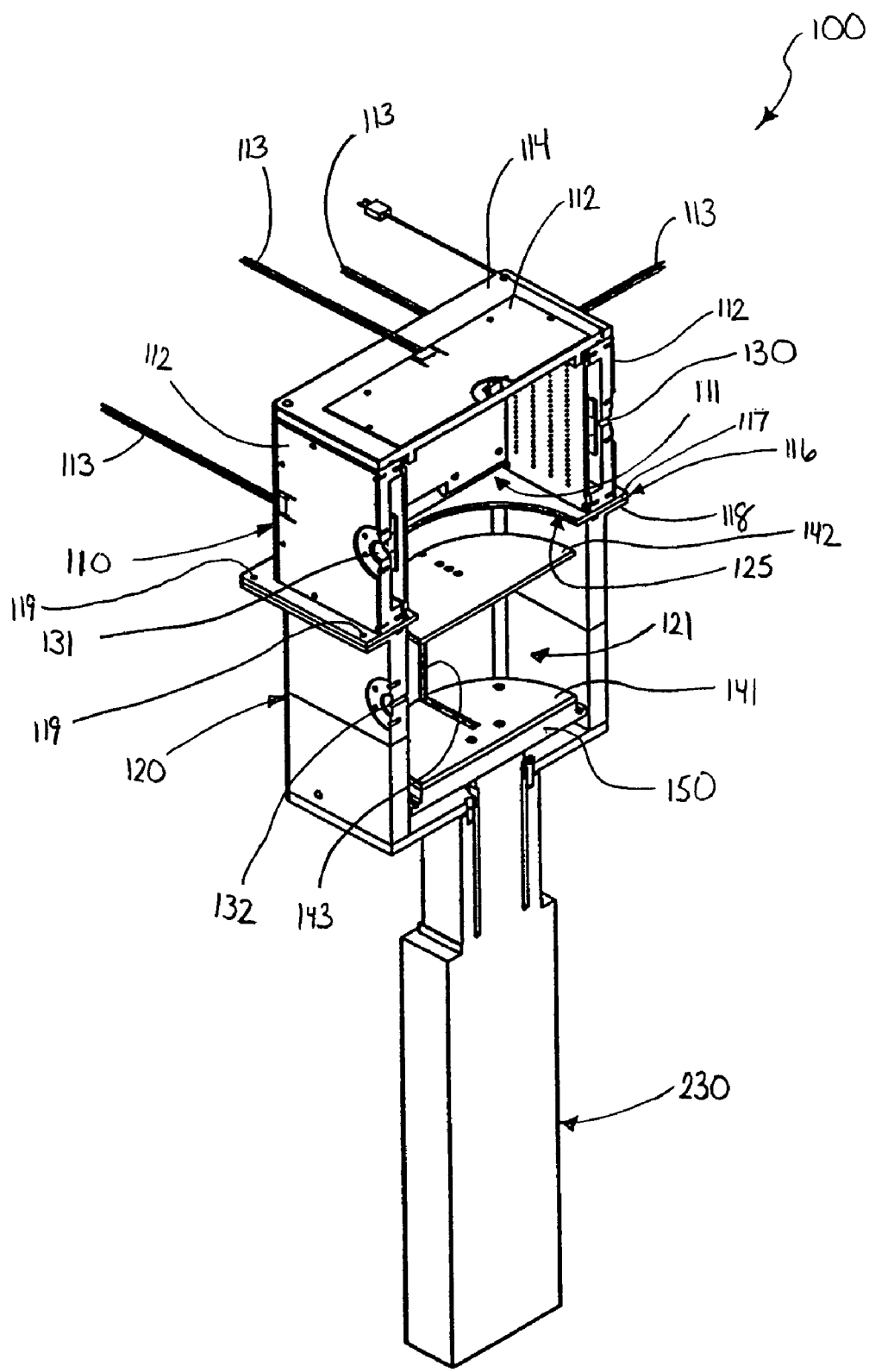
FIG. 3 is a cut-away view of the dual chamber MEMS reactor of FIG. 2 along view III-III.
Figure 4:
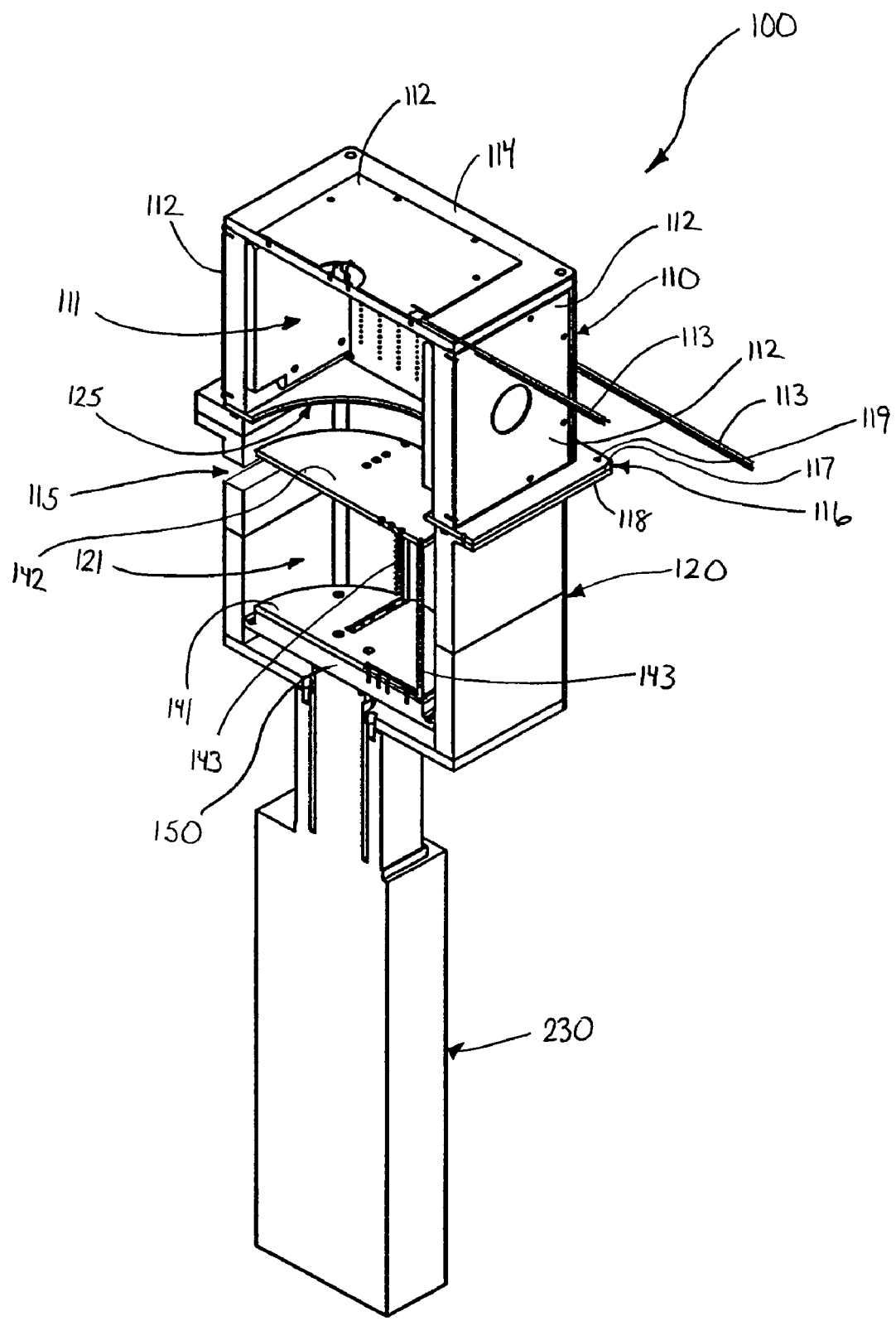
FIG. 4 is a cut-away view of the dual chamber MEMS reactor of FIG. 2 along view IV-IV.

Referring to FIGS. 2-4, a dual chamber MEMS reactor 100 is illustrated according to an embodiment of the present invention. The dual chamber MEMS reactor 100 is designed to support and process a batch of twenty five silicon substrates for MEMS processing/construction. The dual chamber MEMS reactor 100 overcomes the deficiencies of past reactors by eliminating two causes of temperature non-uniformity and eliminating disturbances in fluid flow dynamics.

The dual chamber MEMS reactor 100 comprises a first housing 110 that forms a process chamber 111 and a second housing 120 that forms a substrate loading chamber 121. The first housing 110 sits atop the second housing 120 in a vertical alignment to form a tower-like structure. The first housing 110 sits atop a base 230 which holds a motor (not illustrated) that drives vertical movement of a movable plate 150 that is positioned within the loading chamber 121.

A plurality of heating plates 112 are coupled to the outside surfaces of the first housing 110 for providing heat to the process chamber 111 as needed. A total of five heating plates 112 are coupled to the first housing 110, one on each of the four sides side of the first housing 110 and one on the top surface 114. However, any number of heating plates 112 can be used to heat the process chamber 111. The exact number will be dictated by thermal requirements of the process to be carried out. The heating plates 112 are mica-based resistance heaters. Electrical energy is supplied to the heating plates 112 via power supply lines 113, which are electrically coupled to a source of electricity The functioning of the heating plates 112, including the activation, deactivation, and variance, is controlled by a properly programmed processor. The heating plates 112 provide sufficient thermal energy to heat the process chamber 111 to a temperature of at least 50 degrees Celsius. While heating plates are used to heat the process chamber in the illustrated embodiment of the invention, other types of heaters and heating methods can be used, such as heating wires, lamps, etc. Moreover, the placement of the heaters is not limited to the outside surface of the process chamber's housing, but can be positioned anywhere, including within the process chamber or built into the walls of the process chamber.

Finally, depending on the desired processing conditions, it may be desirable to heat the loading chamber 121 to facilitate thermal uniformity within the chambers and/or to heat the silicon substrates before they enter the process chamber 111.

The second housing 120 comprises a gate opening 115 in one of its side walls. The gate opening 115 is an opening that extends through the side wall of the second housing 120, forming a passageway from the ambient air into the loading chamber 121. The gate opening 115 is used to load and unload silicon substrates into and out of the loading chamber 121. While not illustrated, a gate valve is secured to and operably coupled to the gate opening 115 during operation of the dual chamber MEMS reactor 100. The gate valve is secured to the dual chamber MEMS reactor 100 via bolt holes 116 in the gate valve connector plate 117 (present only in FIG. 2). The gate valve functions to open and close the gate opening 115 as desired. When the gate valve is closed, the gate opening 115 is hermetically sealed. The process chamber 111 and the loading chamber 121 are also hermetically sealed from the ambient air when the gate valve is closed. The functioning of the gate valve is controlled a properly programmed processor.

The first housing 110 also comprises a gas inlet port 130 and an exhaust port 131. The gas inlet port 130 and the exhaust port 131 are located on opposite walls of the first housing 110 to facilitate cross flow fluid dynamics in the process chamber 111. An exhaust port 132 is also provided on the second housing 120. These feature will be discussed in more detail below with respect to FIGS. 5 and 7.

A thermal snap switch 133 is provided on the top surface 114 of the first housing 110.

Referring now exclusively to FIGS. 3 and 4, the first housing 110 and the second housing 120 have a common wall 116. In the illustrated embodiment, the common wall 116 comprises two plates, the floor plate 117 of the first housing 110 and a roof plate 118 of the second housing 120. However, the invention is not so limited and the common wall can consist of single plate or comprise a greater number of plates and/or spacings. The floor plate 117 of the first housing 110 and the roof plate 118 of the second housing 120 are flanged so that the first housing can be properly secured atop the second housing 120. The first housing 110 is secured to the second housing 120 via bolts that extend through corresponding bolt holes 119 of the flanges and engage threaded nuts, thereby securing the flanges of the housings 110, 120 together.

An opening 125 is provided in the common wall 116. The opening 125 provides a passageway from the loading chamber 121 to the process chamber 111. The opening 125 is sized so that a stack of silicon substrates can pass therethrough, as explained below.

Figure 5:
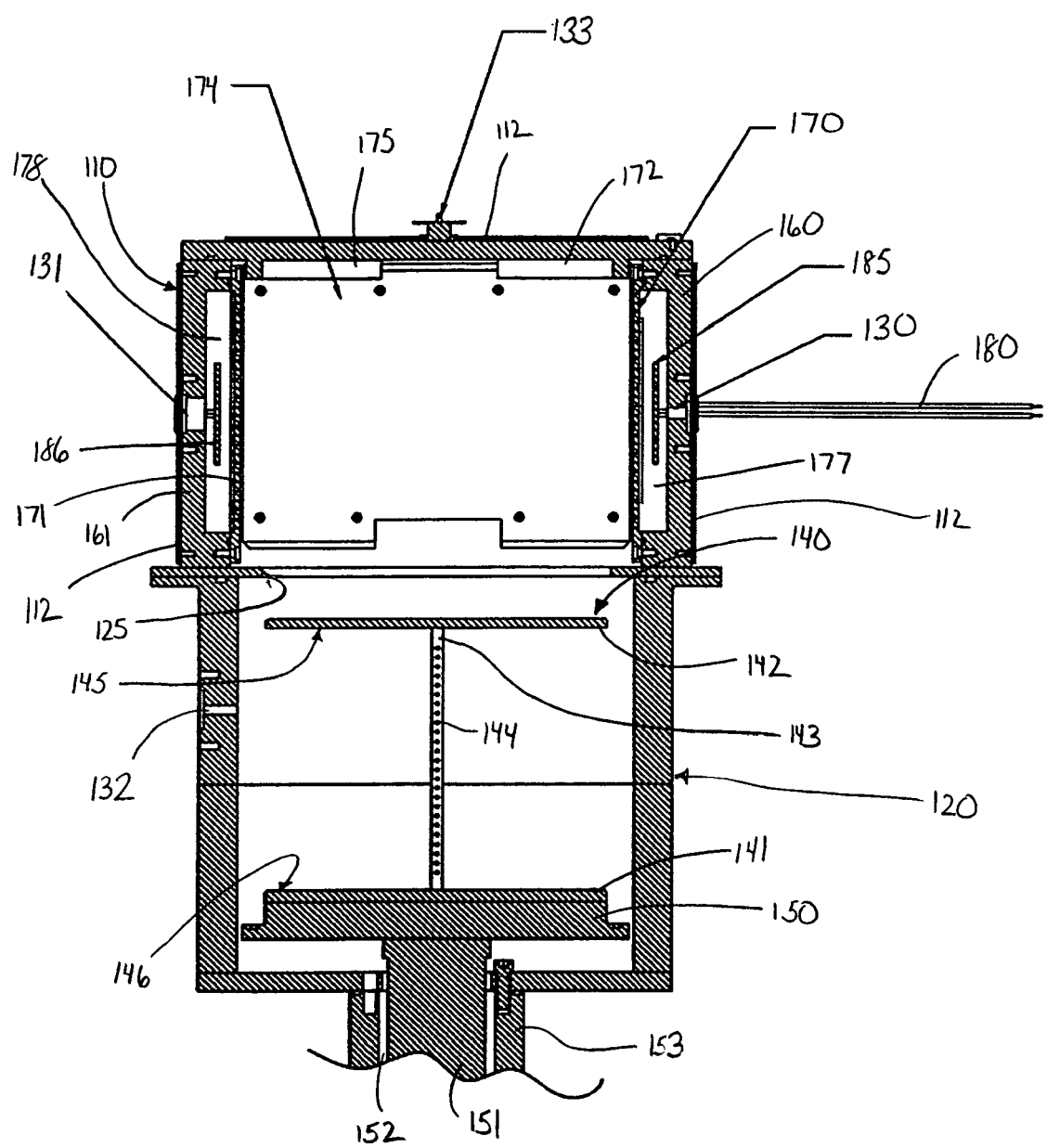
FIG. 5 is a schematic side view of the dual chamber MEMS reactor of FIG. 2 along view III-III.

The dual chamber MEMS reactor 100 also comprises a support rack 140 (best shown in FIG. 5). The support rack 140 comprises a bottom substrate support plate 141, a top substrate support plate 142, and three engaging rods 143 having a plurality of aligned pins 144 (visible in FIG. 5).

Figure 6:
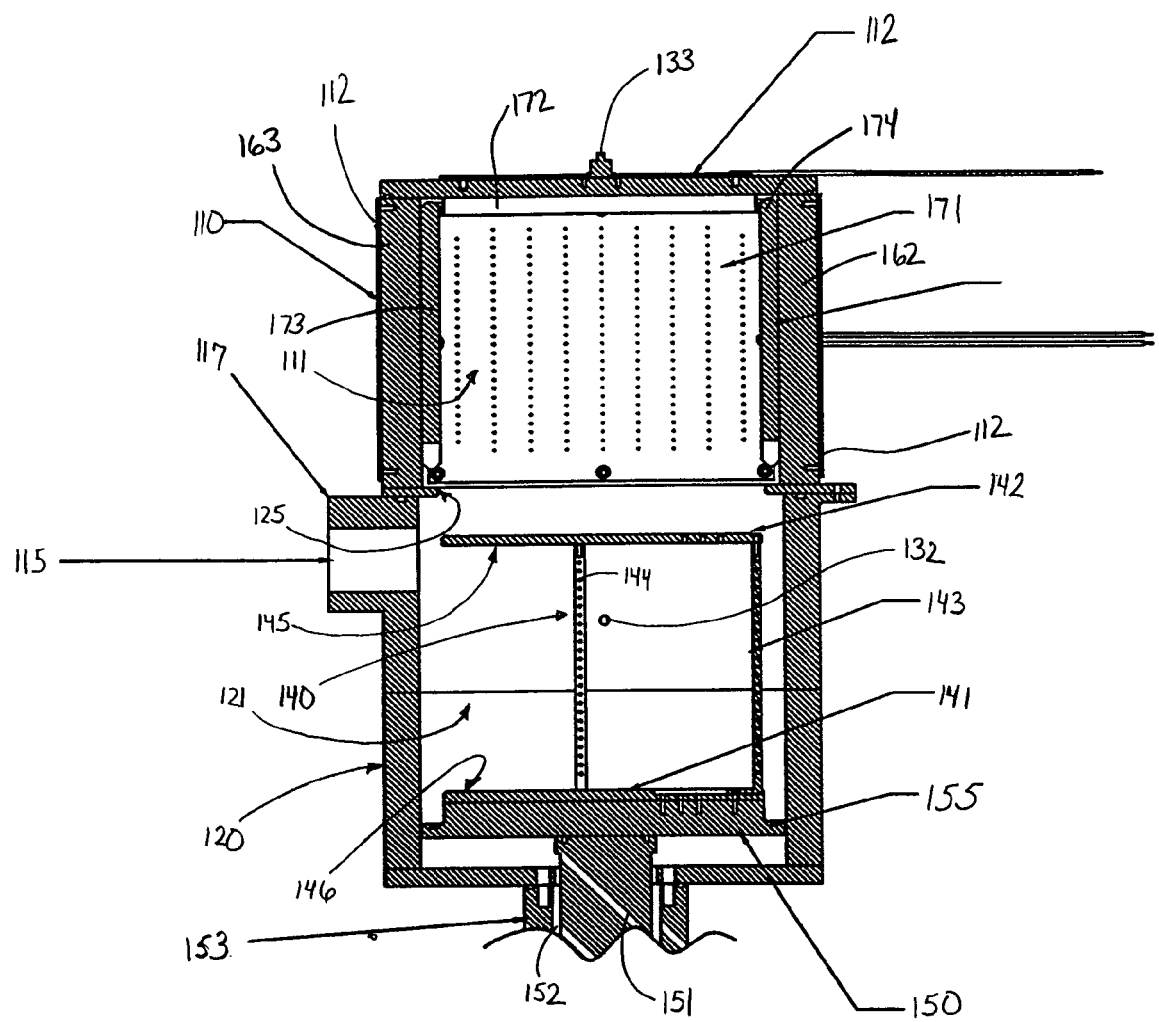
FIG. 6 is a schematic side view of the dual chamber MEMS reactor of FIG. 2 along view IV-IV.
Figure 8:
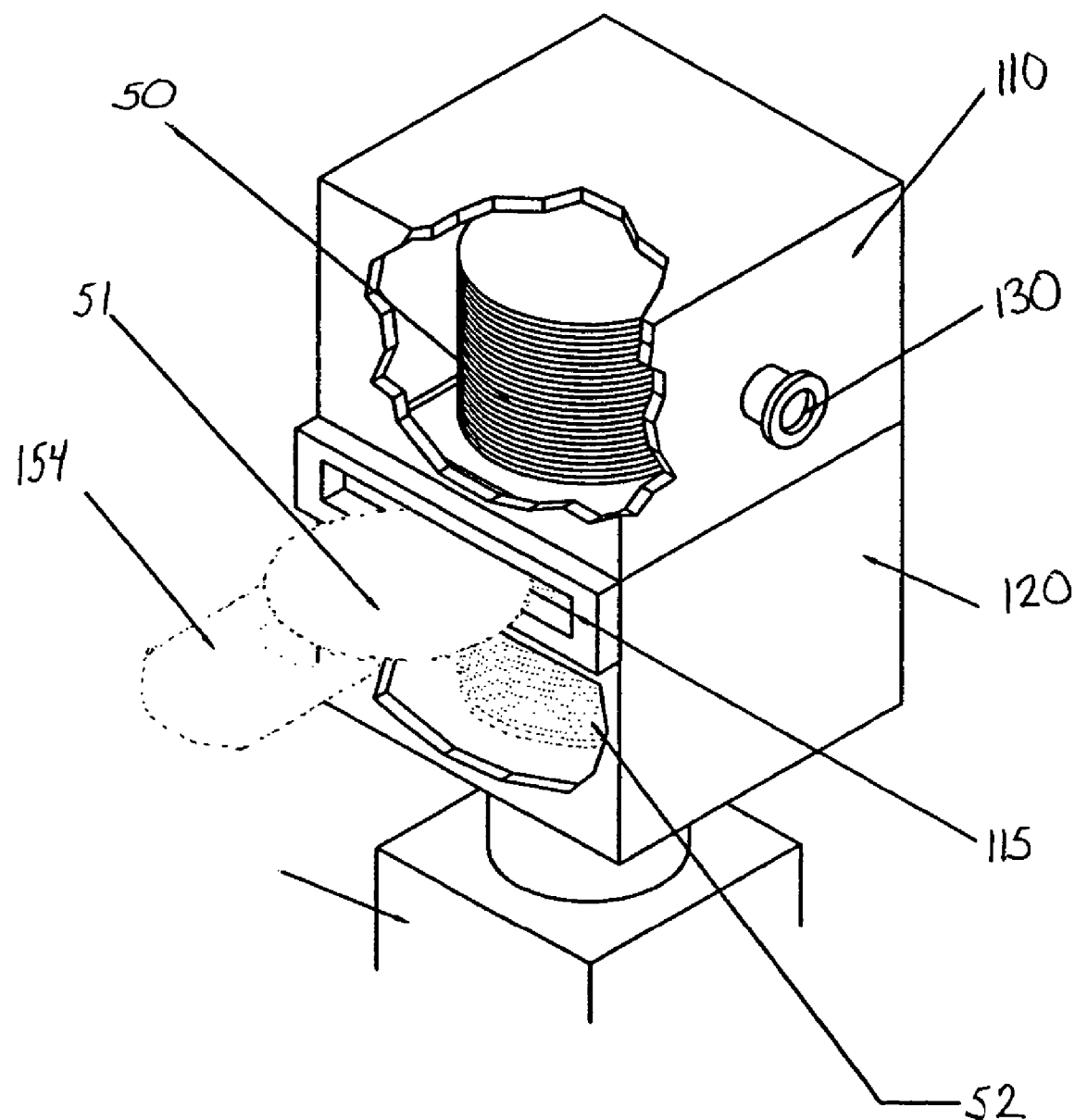
FIG. 8 is a simplified schematic view of the dual chamber MEMS reactor of FIG. 2 with cut away sections illustrating a batch of substrates supported in the process chamber in a stacked orientation according to an embodiment of the invention.

Referring now to FIG. 6, each of the pins 144 of the three engaging rods 143 are in vertical alignment with a corresponding pin 144 on the other two engaging rods 43. As such, when a silicon substrate is inserted into the support rack 140, the silicon substrate will be inserted between a set of three corresponding pins 144 and supported in a substantially vertical orientation. Because a plurality of pins 144 are provided in a vertical arrangement on each of the engaging rods 143, the support rack 140 can support a plurality of silicon substrates in a vertically stacked orientation, such as is illustrated in FIG. 8. The support rack 140 is designed to support twenty five silicon substrates. However, the support rack can be designed to hold any number of silicon substrates. While a support rack is illustrated that supports the plurality of silicon substrates in a vertically stacked orientation, the invention is not so limited. Support racks that support silicon substrates in a horizontally stacked orientation can also be used. The stacked orientation that is preferable will depend on the construction of the system and design criteria.

Referring again to FIG. 6, the bottom substrate support plate 141 is connected atop a movable plate 150 that is positioned within the loading chamber 121 Any means known in the art, such as a plurality of embedded bolts, pins, screws, adhesion, or welding, can be used to connect the bottom substrate support plate 141 to the movable plate 150. Depending on design needs, the support rack 140 can be permanently secured to the movable plate 150 or can be connected so as to be removable therefrom.

The movable plate 150 is secured to a piston 151 that is capable of vertical actuation. The piston 151 rests is operably positioned in an elevator shaft 152 formed by housing 153. The actuating motion of the piston 151 can be facilitated by any means known in the art, such as pneumatic, electrical, or mechanical controls. The functioning of the piston 151, including whether to actuate, the distance of actuation, etc., is controlled by a properly programmed processor, which can be coupled to motion/distance sensors. The means by which the piston 151 is actuated will be dictated by design requirements and preference.

Because the movable plate 150 is secured to the piston 151, vertically actuating/moving the piston 151 results in the movable plate 170 also being vertically actuated/moved. Accordingly, the movable plate 150 can be moved between a loading position and a processing position. In FIG. 6, the movable plate 150 is in the loading position.

Referring now to FIGS. 6 and 8, when the movable plate 150 is in the loading position, at least a portion of the support rack 40 is outside of the process chamber 111. When in the loading position, a silicon substrate 51 can be inserted into the loading chamber 121 by a robot arm 154 via the gate opening 115 until they it is inserted in between the engaging rods 143 of the support rack 140. Once the silicon substrate 51 is fully inserted as such, the robot arm 154 will release the silicon substrate 51, allowing the silicon substrate 51 to be fully supported in a horizontal orientation by a set of the pins 144 of the engaging rods 143. Once the loading of one silicon substrate is completed, the movable plate 150 is raised by the piston 151 until the next set of empty pins 144 is in a position to receive and support another silicon substrate from the robot arm 154. This process is repeated until an entire stack 52 of twenty five silicon substrates is supported by the support rack 140.

Once the support rack 140 is fully loaded, the movable plate 150 continues to be raised until the movable plate is in the processing position. When in the processing position, the entire support rack 140 is within the process chamber 111 and the movable plate 150 closes the opening 125. An O-ring seal 155 is provided in a groove in the top surface of the movable plate 150. When the movable plate 150 is in the process position, the O-ring seal is compressed between the movable plate 150 and the common wall 116. The seal formed by the O-ring seal 155 may or may not be a hermetic seal and will depend on the configuration of the system and processing requirements. Once the movable plate is in the processing position, the stack of silicon substrates 50 are entirely within the process chamber 111 and can be processed accordingly.

Because the plurality of silicon substrates are supported in a stacked orientation within the process chamber 111, the stacked orientation will naturally have a first substrate and a last substrate. In the case of a vertical stack, the first and last substrate will be the top substrate and the bottom substrate of the vertical stack respectively. When the plurality of silicon substrates are supported in the process chamber 111 for processing, both the top substrate and the bottom substrate in the stack 50 will have an exposed surface. More specifically, the bottom surface of the bottom substrate will be an exposed surface and the top surface of the top substrate will be an exposed surface. As used herein, an exposed surface of a substrate is the surface of a substrate that does not face another substrate in the stack.

In order to promote thermal uniformity among all of the silicon substrates in the stack 50, it has been discovered that is desirable to ensure that the surfaces of dual chamber MEMS reactor 100 that opposes the exposed surfaces of the top and bottom substrates when the stack 50 is in the process chamber 111 have an emissivity value that corresponds to the emissivity value of the exposed surfaces of the top and bottom silicon substrates.

Referring to FIG. 5, when the plurality of silicon substrates are loaded onto the support rack 140 and supported in the process chamber 121, the exposed surface of the top silicon substrate in the stack will oppose the bottom surface 145 of the top substrate support plate 142. Meanwhile, the exposed surface of the bottom silicon substrate will oppose the top surface 146 of the bottom substrate support plate 141. Accordingly, both the bottom and top surfaces 145, 146 of the substrate support plates 142, 141 are constructed of a material having an emissivity value that corresponds to the emissivity value of the exposed surfaces of the top and bottom silicon substrates. In this embodiment, because the substrates are silicon, the bottom and top surfaces 145, 146 are silicon carbide. However, the top and bottom surfaces 145, 146 can be constructed of any material which has an emissivity value that corresponds to the emissivity value of the exposed surfaces of the substrates. Suitable materials are preferably non-contaminating and can withstand processing conditions within the process chamber.

While in the illustrated embodiment of the dual chamber MEMS reactor 100, the opposing surfaces (i.e., the surfaces that oppose the exposed surfaces of the silicon substrates) are located on the top and bottom substrate support plates 141, 142 of support rack 140, this will not always be the case. When utilizing alternative support rack embodiments, the exposed surfaces of the silicon substrates may oppose the inner surfaces of the process chamber 111 itself. In such an embodiment, such inner surfaces of the process chamber will be constructed of a material having an emissivity value that corresponds to the emissivity value of the exposed surfaces of the substrates. This is an important factor since all the substrates in the stack will face each other, except for the first and last substrates which will face outward. Thus, by more closely matching the opposing surface emissivity to that of silicon (in the case of a silicon substrate), close temperature control was possible for all 25 substrates.

Figure 10:
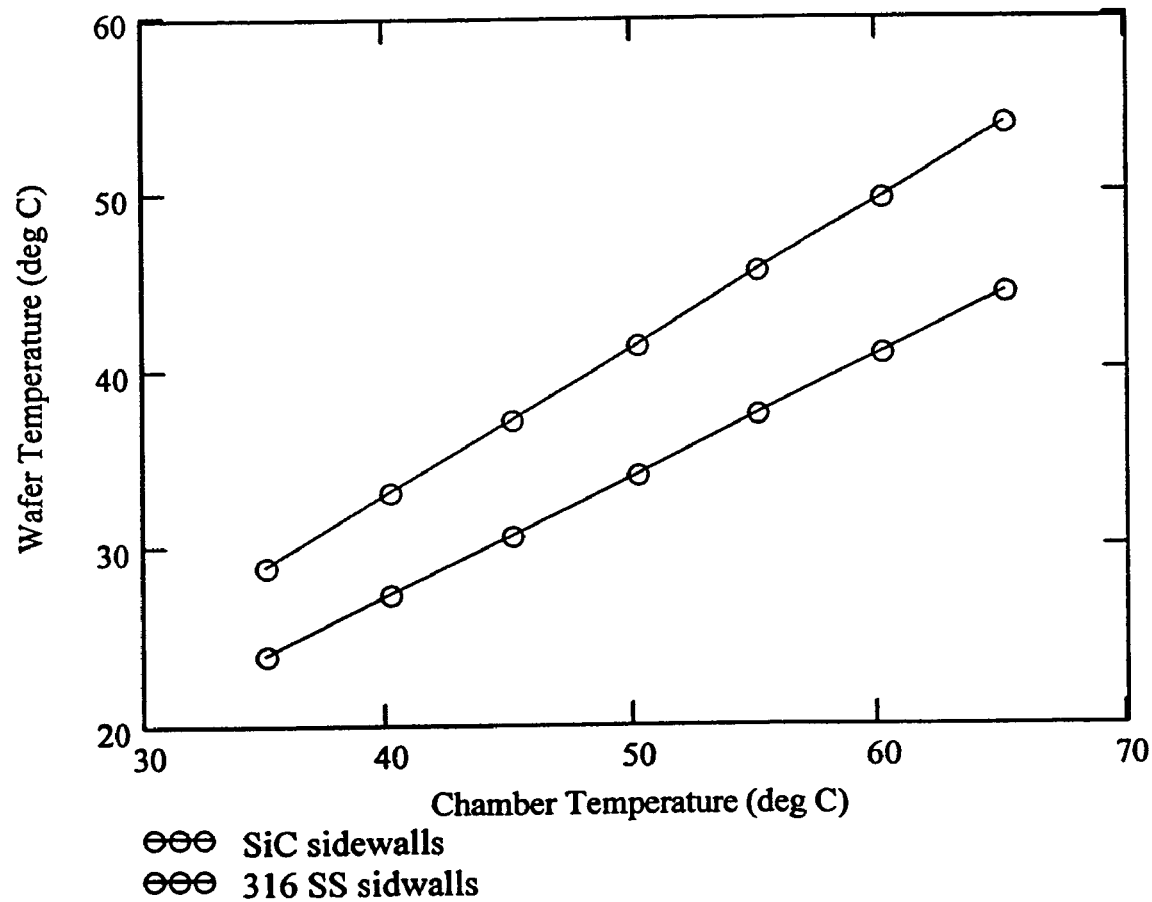
FIG. 10 is a graph of substrate temperature vs. process chamber temperature for a process chamber having stainless steel side walls and a process chamber having silicon carbide side walls.

Referring now to FIG. 10, a graph is illustrated plotting substrate temperature v. chamber temperature. This graph represents the effect that the material with which the sidewalls of the chamber are constructed have on silicon substrate temperature at 100 Torr, which is a typical process pressure. In collecting the data for the graph of FIG. 10, an experiment was performed where the silicon substrate was facing two different surfaces of equal temperature, 316 Stainless Steel in one trial and Silicon Carbide in another. These materials were selected due to the chemical compatibility, but other materials may have been chosen that exhibit the same properties. Note that the silicon substrate more closely mimics the temperature of the silicon carbide surface than that of the stainless steel surface.

Referring to FIGS. 5 and 6, the first housing 110 is constructed so as to have a shell and a liner. The shell comprises walls 160-163 and roof plate 164. The liner comprises gas inlet manifold 170, exhaust manifold 171, and liner plates 172-175. The liner elements 170-175 are all constructed of densified carbon. The inner surfaces (i.e., the surface that form the process chamber 111) of all liner elements 170-175 are silicon carbide. Methods for converting a carbon surface to silicon carbide are known in the art. While densified carbon was used, any material having high thermal conductivity can be used, such as for example other carbon based materials, such as diamond, graphite, natural carbon, etc. The shell elements 160-164 are constructed of stainless steel. However, other non-porous materials can be used. The thermal conductivity of 316 stainless steel is about 44 W/m/K and the thermal conductivity of densified carbon is nearly double at 70 W/m/K.

Providing a liner constructed of a material having high thermal conductance properties and having inner surfaces having an emissivity value that corresponds to the emissivity value of the exposed surfaces of the silicon substrates helps achieve thermal uniformity throughout the process chamber 111 and the substrate stack. The non-porous shell is provided because the densified carbon is porous. Thus, providing a non-porous shell exterior to the liner allows for a reduced pressure atmosphere to be created within the process chamber 111 without leakage of ambient air into the process chamber 111.

Figure 9:
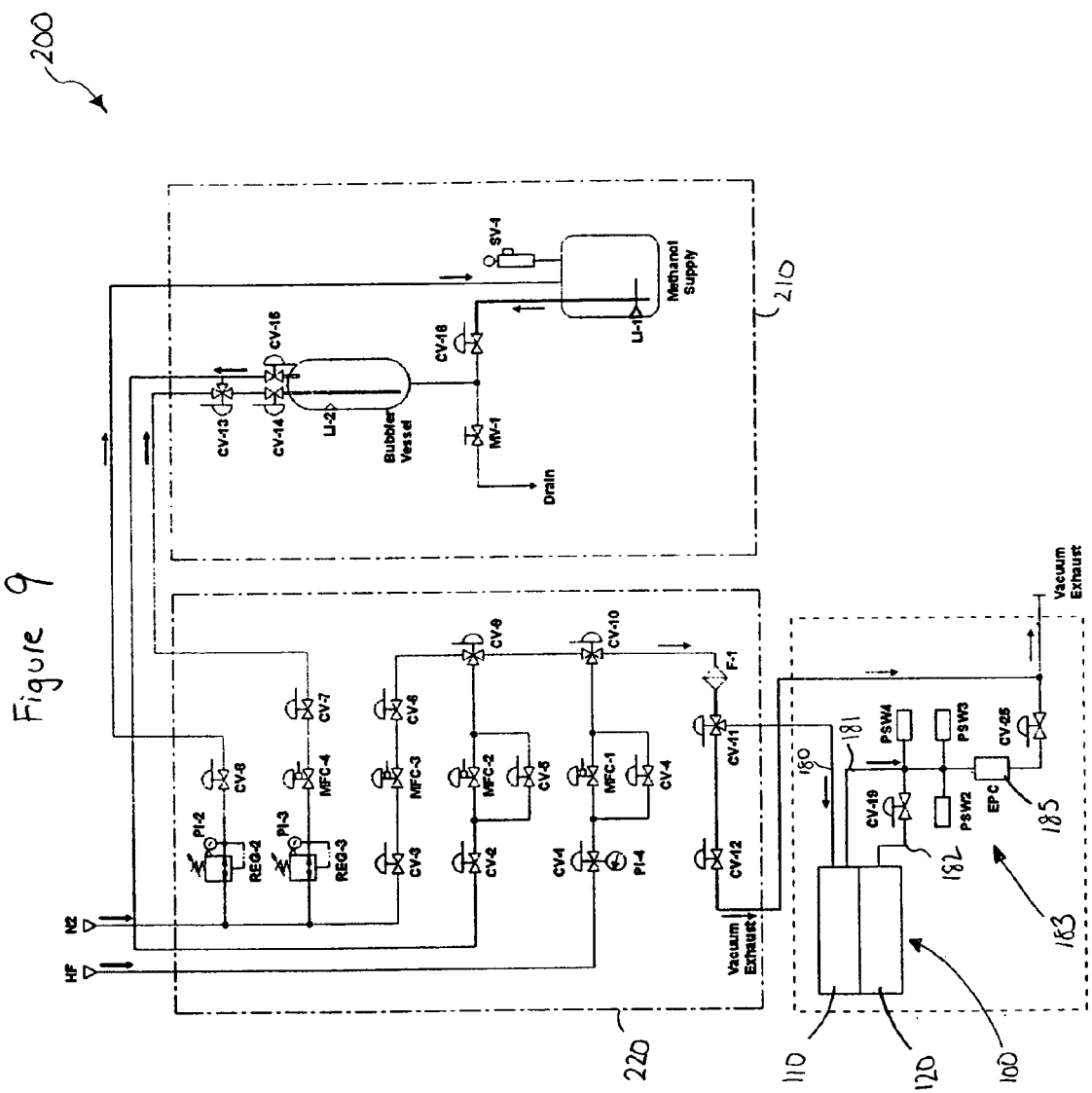
FIG. 9 is a plumbing schematic for a MEMS processing system according to an embodiment of the present invention.

Referring now to FIG. 5, characteristics of the dual chamber MEMS reactor 100 that affect fluid flow dynamics within the process chamber 111 will now be discussed. As discussed above, the first housing 110 comprises a gas inlet port 130 and an exhaust port 131. The gas inlet port 130 and the exhaust port 131 are located in opposite walls 160, 161 of the first housing 110. Positioning the ports 130, 131 in opposite walls facilitates cross flow of the gases through the process chamber 111 for substrate processing. A gas supply line 180 is operably and fluidly connected to the gas inlet port 130. The gas supply line 180 is fluidly coupled to a source of at least one gas (as illustrated in FIG. 9). Preferably, in order to facilitate etching of substrates, the gas supply line 180 is coupled to at least a source of alcohol vapor and a source of HF vapor.

The gas inlet port 130 and the exhaust port 131 are located substantially in the center of the walls 160, 161 of first housing 110 respectively. To achieve a more uniform cross flow, a special gas inlet manifold 170 and a special exhaust manifold 171 were created and positioned in the process chamber 111 as shown. The gas inlet manifold 170 is positioned so as to cover the gas inlet port 130 while the exhaust manifold 171 is positioned so as to cover the exhaust ports 131. The spacing of the manifolds 170, 171 from the walls 160, 161 respectively create manifold cavities 177, 178. In order to eliminate undue velocity pressure within the manifold cavities 177, 178, both the gas inlet port 130 and the exhaust port have a gas diffuser plate 185, 186 operably coupled thereto. The gas diffuser plate 185 is operably coupled to the gas inlet port 130 and is positioned within manifold cavity 177, between the gas inlet port 130 and the gas inlet manifold 170. Similarly, the gas diffuser plate 186 is operably coupled to the exhaust port 131 and is positioned within manifold cavity 178, between the exhaust port 131 and the exhaust manifold 171.

As explained above, during substrate processing, the movable plate 150 is raised to the processing position. When in the processing position, the movable plate 150 forms the floor of the process chamber 110. When this happens, the process chamber 111 has a substantially constant rectangular cross-sectional profile extending from the inlet manifold 170 to the exhaust manifold 171. Having a substrate process chamber with a substantially constant cross-sectional profile creates a cross flow that is very streamlined and uniform between all substrates during processing. The process gas flows through the constant cross-sectional profile until it exits the process chamber 111 via the exhaust manifold 171. The movable plate 150 is lightly sealed so that no convection-loops or short circuit flows will take place within the process chamber 111. While the process chamber is illustrated as having a substantially constant rectangular cross-sectional shape, the cross-sectional profile can be almost any shape so long as it is substantially constant. The ability to create a process chamber having a substantially constant cross-sectional profile is achieved by designing the process chamber so that any cavities or irregularities associated with the load/unload "gate opening" opening were eliminated.

Figure 7:
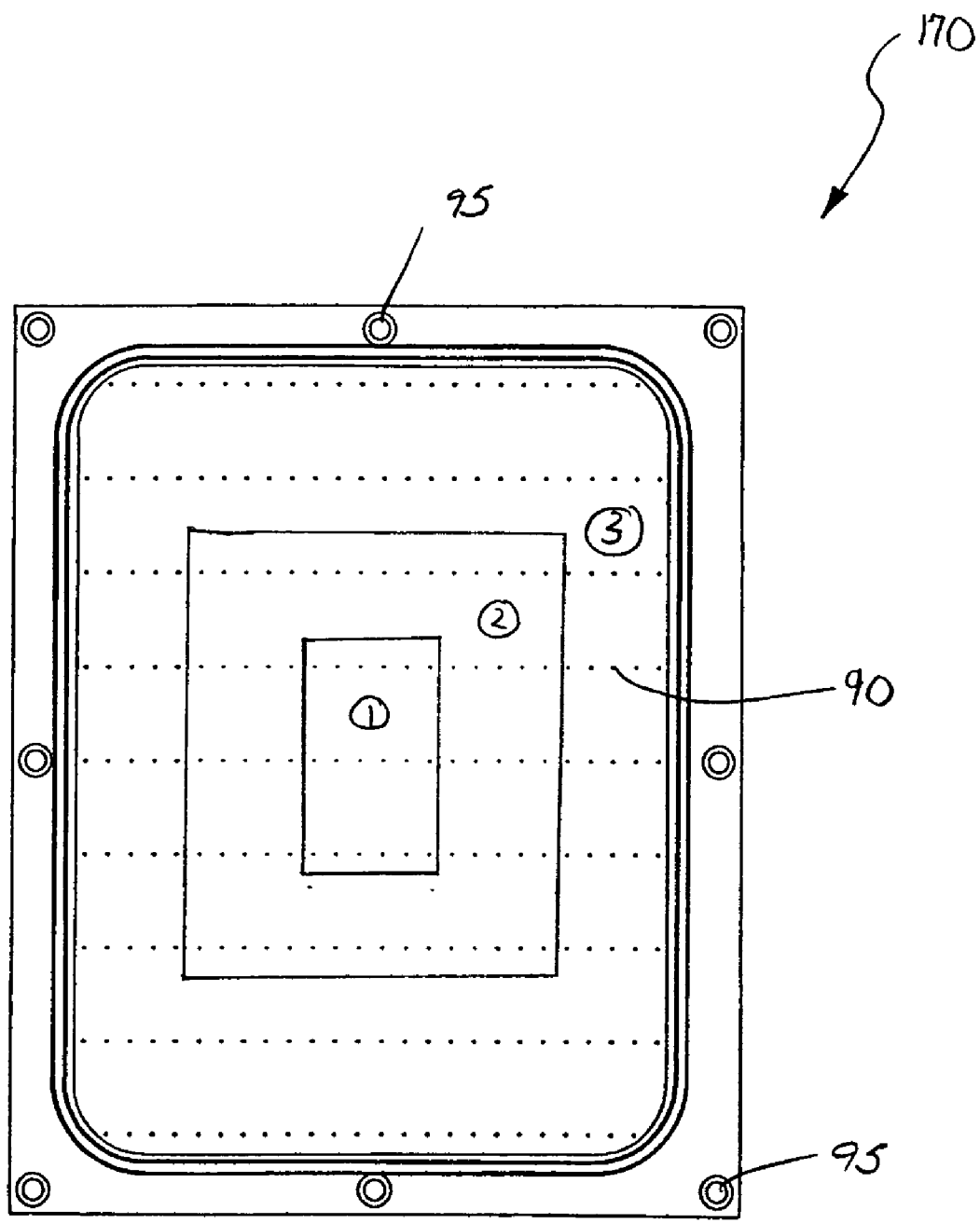
FIG. 7 is a front view of a gas inlet manifold used in the dual chamber MEMS reactor of FIG. 2 according to an embodiment of the present invention.

Referring now to FIG. 7, the details of the specially designed inlet manifold 170 are illustrated. Inlet manifold 170 comprises a plurality of distribution holes 190 arranged in linear patterns. The diameter of the distribution holes 190 increases with radial distance from the center of inlet manifold 170. For ease of explanation, the inlet manifold 170 is illustrated as being separated into three zones, zone 1, zone 2, and zone 3. The distribution holes 190 located solely in zone 1 have a diameter of 0.15 inches. The distribution holes 190 located solely in zone 2 have a diameter of 0.18 inches. The distribution holes 190 located solely in zone 3 have a diameter of 0.26 inches. Increasing the size of the openings 190 as distance from the ports 130, 131 increases balances out the (velocity and static) total manifold pressure.

Inlet manifold 170 also comprises a plurality of bolt holes 95 around its perimeter for securing the manifold 170 in place within the process chamber 111. The exhaust manifold 171 is identical to the inlet manifold 170 as illustrated in FIG. 7. Discussion will be omitted to avoid redundancy.

Referring now to FIG. 9, a plumbing schematic of a MEMS processing system 200 is illustrated for operation of the dual chamber MEMS reactor 100. The MEMS processing system 200 comprises a liquid cabinet 210 and a gas cabinet 220. By providing and properly positioning the various supply lines, pumps, and valves in the system 200, a source of HF vapor 211, a source of nitrogen gas 212, and a source of alcohol vapor 213 are operably coupled to the gas supply line 180. The nitrogen gas can be used to purge the process chamber 111 and the loading chamber 121 as necessary or it can be used as a carrier gas. All components of the system 200 are electrically coupled to and controlled by a properly programmed processor that is programmed to execute user inputted processing recipes.

Exhaust lines 181, 182 are fluidly and operably coupled exhaust port 131 of the first housing 110 and the exhaust port 132 of the second housing 120 respectively (see also FIG. 5 for clarity). The exhaust lines 181, 182 and their associated components form an exhaust system 183. A dry pump 185 is operably coupled to the exhaust system 183. When activated, the dry pump 185 will create a reduced pressure atmosphere within the process chamber 111 and the loading chamber 121.

The new design of the dual chamber MEMS reactor 100 is able to process up to 25 substrates at a time with uniformities (substrate to substrate, on substrate, batch to batch) within acceptable limits and even better than with older reactors. Substrate temperatures can be controlled within 1 degree Centigrade, with associated improved etch control.

Of course, if it is desired, more than 25 substrates could be processes at a time. However, to achieve highest throughput with the automated handler (in this case a Brooks 7 sided), and to process a complete substrate cassette at a time, a quantity of 25 substrates proved to be advantageous. Larger batches have diminishing returns.

A throughout analysis was performed to determine the optimal size of the substrate batch and the effects on uniformity. The results of this analysis are set forth in FIGS. 11-13. This simulation as set up with a Brooks seven sides transfer chamber, two LoadLocks and up to five CET chambers. No Inligner was used in this configuration. Substrates were transferred one by one from LoadLocks into CET chamber, start the process when the CET chamber is full, and then transferred back to LoadLocks. CET chambers were designed to process 1, 3, 5, 25 & 50 substrates/recipe A typical 30 minutes HF etching recipe is broken down into the following steps per chamber capacity. At the end of recipe, the CET chamber will pump down to base pressure before proceeding with substrate transfer, the pump down time is added to the "Total time in CET chamber".

| Step | Step Name/ Chamber Capacity | 1 | 3 | 5 | 25 | 50 |
|---|---|---|---|---|---|---|
| 1 | N2/BuOH stabilization | 3 | 3 | 3 | 5 | 7 |
| 2 | HF etching | 15 | 15 | 15 | 15 | 15 |
| 3 | Pump down | 2 | 2 | 2 | 3 | 5 |
| 4 | N2/BuOH stabilization | 2 | 2 | 2 | 3 | 5 |
| 5 | HF etching | 15 | 15 | 15 | 15 | 15 |

-continued

| Step | Step Name/Chamber Capacity | 1 | 3 | 5 | 25 | 50 |
|---|---|---|---|---|---|---|
| 6 | Pump down | 1 | 1 | 1 | 2 | 4 |
| 7 | Purge | 10 s | 10 s | 10 s | 10 s | 10 s |
| 8 | Pump down | 1 | 1 | 1 | 2 | 4 |
| 9 | Purge | 10 s | 10 s | 10 s | 10 s | 10 s |
| 10 | Pump down | 1 | 1 | 1 | 2 | 4 |
| 11 | Purge | 10 s | 10 s | 10 s | 10 s | 10 s |
|  | Pump to base before transfer | 1 | 1 | 1 | 2 | 3 |
|  | Total time in CET chamber | 41.5 | 41.5 | 41.5 | 58.5 | 62.5 |

For LoadLockA/B, the times to load/unload cassettes, vent to atmosphere and pump down to base pressure are listed with the following action:

Vent up (from vacuum to atmosphere): 4 minutes.
Load/Unload cassette: 1 minute.
Pump down (from atmosphere to vacuum): 3 minutes.

Figure 11:
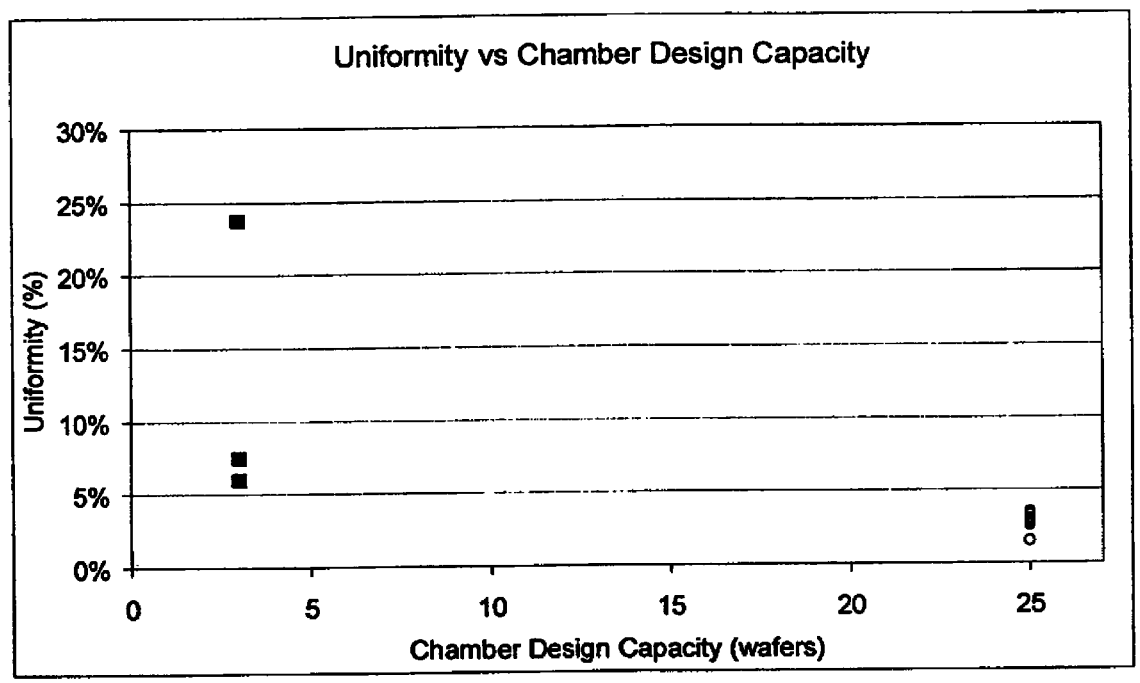
FIG. 11 is a graph of uniformity percentage vs. process chamber design capacity
Figure 12:
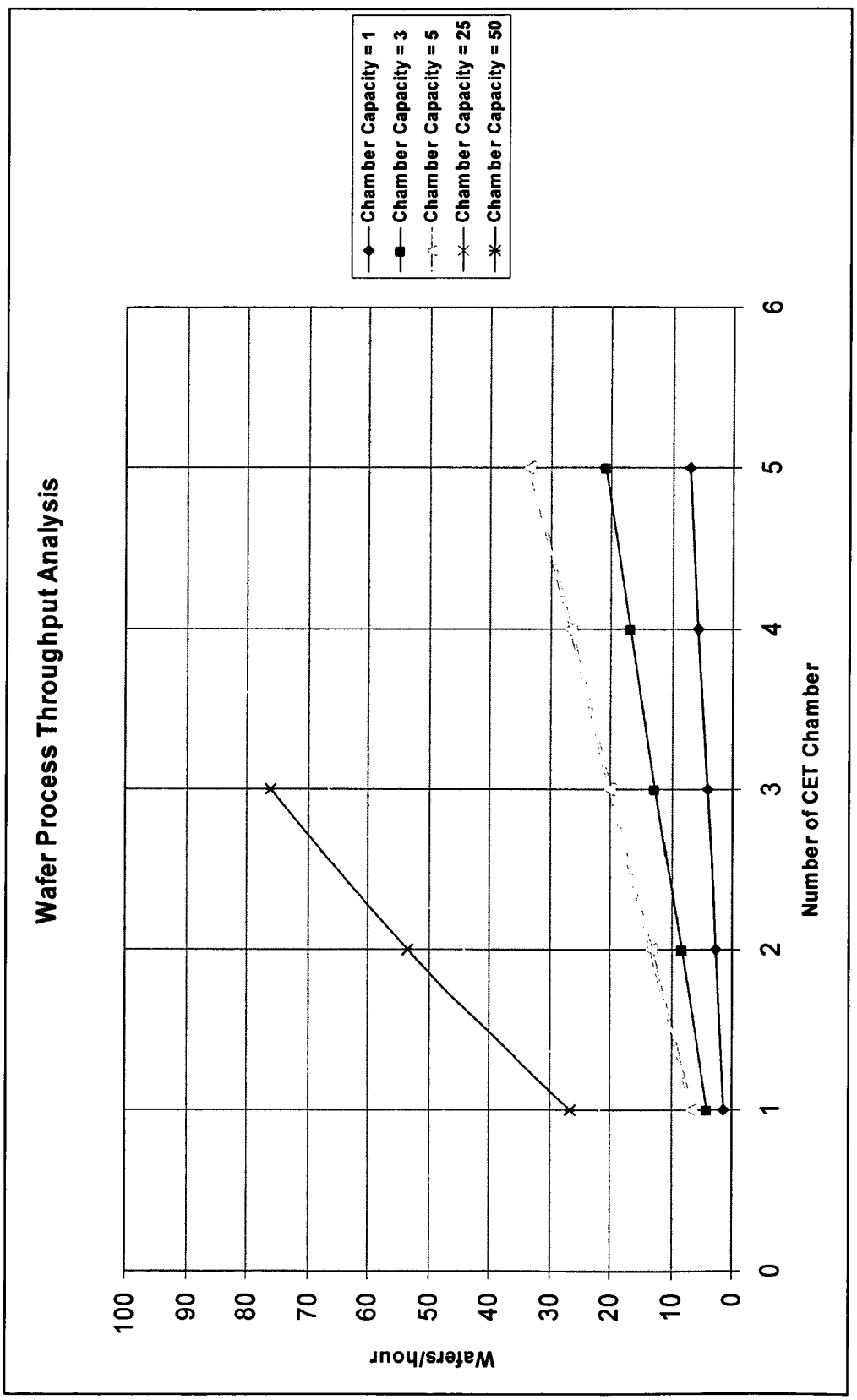
FIG. 12 is a graph of substrates per hour v. number of CET chambers for various chamber capacity.
Figure 13:
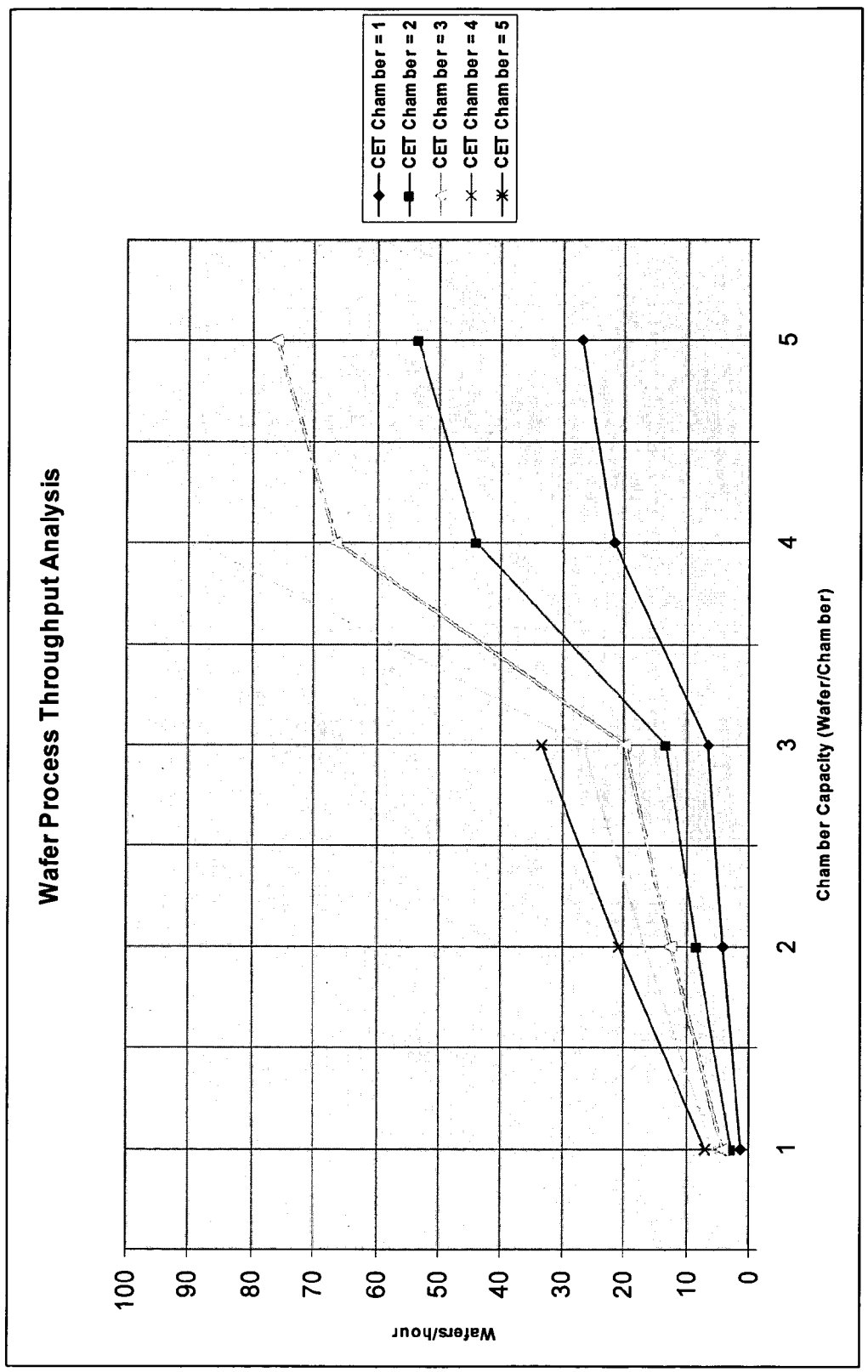
FIG. 13 is a graph of substrates per hour vs. chamber capacity for various numbers of CET chambers.

Typical substrate transfer time (LoadLockA/B←→CET Chamber) is 20~25 seconds. The charts in FIGS. 11-13 are calculated with minimum 10 hours period. When chamber capacity is 1, 3, 5 or 50, the LoadLocks are configured as both input/output ports. When chamber capacity is 25, the LoadLockA is configured as input port, LoadLockB is configured as output port.

|  | Number of CET chamber | | | | |
|---|---|---|---|---|---|
|  | 1 | 2 | 3 | 4 | 5 |
| Chamber Capacity: 1 | 1.4 | 2.8 | 4.2 | 5.7 | 7.1 |
| Chamber Capacity: 3* | 4.1 | 8.3 | 12.5 | 16.7 | 20.8 |
| Chamber Capacity: 5 | 6.6 | 13.2 | 19.9 | 26.6 | 33.3 |
| Chamber Capacity: 25 | 21.7 | 44.1 | 66.5 | 88.9 | — |
| Chamber Capacity: 50 | 26.7 | 53.4 | 76.1 | — | — |

*Both cassettes are loaded with 24 substrates instead of 25.

While the invention has been described and illustrated in detail, various alternatives and modifications will become readily apparent to those skilled in the art without departing from the spirit and scope of the invention. Specifically, the invention is not limited to being used in etching processes can be used in any substrate process where thermal and fluid flow uniformity is desired.

What is claimed is:

1. A system for processing substrates comprising:
a first housing forming a process chamber;
a second housing forming a loading chamber;
a gate opening in said second housing that forms a passageway for one silicon substrate into said loading chamber;
a robot arm adapted to insert said one substrate into said loading chamber into a movable plate via said gate opening;
said movable plate having means to support a plurality of substrates in a vertically stacked orientation;
means to move said movable plate between a loading position where said means to support is located at least partially outside of said process chamber and a processing position where said means to support is located entirely within said process chamber, wherein when in said process position said movable plate closes said opening;
a gas inlet port in said first housing;
a substantially rectangular gas inlet manifold having a two-dimensional array of distribution holes, said gas inlet manifold positioned so as to cover the gas inlet port;
a gas diffuser plate within said gas inlet manifold;
a source of gas fluidly coupled with said gas inlet port comprising a source of alcohol vapor and a source of hydrofluoric acid gas;
an exhaust port in said first housing;
a substantially rectangular exhaust manifold having a two-dimensional array of exhaust holes, said exhaust manifold positioned so as to cover the exhaust port;
a gas diffuser plate within said exhaust manifold;
said inlet manifold and said exhaust manifold located at opposite sides of said first housing forming said process chamber;
said first housing forming said process chamber having a substantially rectangular cross-sectional profile extending from said inlet manifold to said exhaust manifold when said movable plate is in the processing position; and
an exhaust system operably coupled to said exhaust port.

2. The system of claim 1 further comprising a seal positioned between said movable plate and the first housing.

3. The system of claim 2 wherein said seal comprises an O-ring.

4. The system of claim 1 wherein said inlet manifold and said exhaust manifold comprise distribution holes organized in a radial pattern of increasing size.

5. The system of claim 1 further comprising a means for creating a reduced pressure atmosphere in said process chamber.

6. The system of claim 5 wherein said means for creating said reduced pressure atmosphere is located on an exhaust system that is coupled to said exhaust port.

7. The system of claim 1 further including a plurality of substrates supported in a vertically stacked orientation in said process chamber by said means to support, said plurality of substrates comprising a first substrate having an exposed surface and a last substrate having an exposed surface, said exposed surfaces of said first and last substrates having an emissivity value; and said process chamber comprising surfaces that oppose said exposed surfaces of said first and last substrates when said plurality of substrates are supported in said stacked orientation within said process chamber, said opposing surfaces of said process chamber having an emissivity value that corresponds to said emissivity value of said exposed surfaces of said first and last substrates.

8. The system of claim 7 wherein said emissivity value of said opposing surfaces is within a range of about 0.2 of said emissivity value of the exposed surfaces of said first and last substrates.

9. The system of claim 8 wherein said substrates are silicon and said opposing surfaces are silicon carbide.

10. The system of claim 7 wherein said supporting means comprises a first substrate support plate and a second substrate support plate, said plurality of substrates being supported in said stacked orientation between said first and second substrate support plates, said opposing surfaces being surfaces of said first and second substrate support plates.

11. The system of claim 7 wherein said first housing comprises a liner constructed of a material which has high thermal conductance, said liner having inner surfaces that form said process chamber, said inner surfaces having an emissivity value that corresponds to said emissivity value of said exposed surfaces of said first and last substrates.

12. The system of claim 11 wherein said liner is constructed of a carbon based material.

13. The system of claim 12 wherein said carbon based material is selected from a group consisting of densified carbon, natural carbon, diamond, and graphite.

14. The system of claim 12 wherein said inner surfaces of said liner are silicon carbide.

15. The system of claim 11 wherein said first housing comprises a shell constructed of a nonporous material, said liner being interior of said shell.

16. The system of claim 13 wherein said liner comprises an inlet manifold and an exhaust manifold.

17. The system of claim 1, said second chamber having a common wall with said first housing, said opening extending through the common wall and forming a passageway from the loading chamber into the process chamber, said second housing having a gate opening that forms a passageway from ambient air into said loading chamber.

18. The system of claim 17 further comprising a gate valve operably coupled to said gate opening, wherein when said gate valve is closed, said process chamber and said loading chamber are hermetically sealed from said ambient air.

19. The system of claim 1 further comprising means to heat said process chamber.

20. The system of claim 1 wherein said supporting means can support at least 25 substrates.

21. The system of claim 1 further comprising said second chamber having a common wall with said first housing, the opening extending through said common wall and forming a passageway from said loading chamber into said process chamber, said second housing having a gate opening that forms a passageway from ambient air into said loading chamber; a gate valve operably coupled to the gate opening, wherein when said gate valve is closed, said process chamber and said loading chamber are hermetically sealed from said ambient air; a seal positioned between said movable plate and said common wall; an exhaust system operably coupled to said exhaust ports of the first housing and second housing; wherein said gas inlet port and exhaust port of the process chamber are located on opposite walls of said first housing; means for creating a reduced pressure atmosphere in the process chamber, said means being operably coupled to the exhaust system; wherein said supporting means supports the plurality of substrates in a stacked orientation in the process chamber, said stacked orientation comprising a first substrate having an exposed surface and a last substrate having an exposed surface, said exposed surfaces of said first and last substrates having an emissivity value; said system further comprising surfaces that oppose said exposed surfaces of the first and last substrates when the plurality of substrates are supported in said stacked orientation within said process chamber, said opposing surfaces having an emissivity value that corresponds to said emissivity value of said exposed surfaces of said first and last substrates; said first housing comprising a liner constructed of a carbon based material and a shell surrounding the liner, that is constructed of a nonporous material; wherein said liner comprised said gas inlet manifold and the exhaust manifold and means to heat said process chamber.

22. A method of processing substrates comprising:
providing a system according to claim 1;
supporting a plurality of substrates in said supporting means while said movable plate is in said loading position;
moving said movable plate to said processing position, thereby closing said opening with said movable plate; and
flowing hydrofluoric acid gas into said process chamber via said gas inlet port, over said plurality substrates, and out of said process chamber via said exhaust port.

23. The system of claim 1 wherein said gas inlet manifold and said gas exhaust manifold are rectangular and have a height and width at least that of the height and width, respectively, of the stack and positioned for streamlined flow over all the wafers.

24. The system of claim 1 wherein said inlet and exhaust manifolds having distribution holes whose diameter increases with increasing distance from the center.

* * * * *